United States Patent
Koelling et al.

(10) Patent No.: US 6,512,705 B1
(45) Date of Patent: Jan. 28, 2003

(54) METHOD AND APPARATUS FOR STANDBY POWER REDUCTION IN SEMICONDUCTOR DEVICES

(75) Inventors: Jeff Koelling, Fairview, TX (US); John Schreck, Lucas, TX (US); Jon Morris, Plano, TX (US); Rishad Omer, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/989,964

(22) Filed: Nov. 21, 2001

(51) Int. Cl.$^7$ .................................................. G11C 7/00
(52) U.S. Cl. ............................ 365/189.11; 365/230.03; 365/229
(58) Field of Search ........................... 365/189.11, 227, 365/229, 185.23, 230.06

(56) References Cited

U.S. PATENT DOCUMENTS

| | | | | |
|---|---|---|---|---|
| 5,604,711 A | * | 2/1997 | Cueung | 365/230.06 |
| 5,703,825 A | * | 12/1997 | Akiba et al. | 365/189.11 |
| 6,104,665 A | * | 8/2000 | Hung et al. | 365/230.06 |
| 6,236,617 B1 | * | 5/2001 | Hsu et al. | 365/230.06 |
| 6,414,899 B2 | * | 7/2002 | Afghahi et al. | 365/230.06 |

* cited by examiner

Primary Examiner—Tan T. Nguyen
(74) Attorney, Agent, or Firm—Hugh R. Kress; Winstead Sechrest & Minick, P.C.

(57) ABSTRACT

A word line driver circuit for a semiconductor memory device. One or more transistors in the driver circuit are fabricated such that they are susceptible, under certain conditions, to gate-induced diode leakage (GIDL). One terminal of the transistors are coupled to a local supply node, which during standby conditions when the word line driver circuit is not driving a word line, is maintained at a voltage less than that of a global power supply node. In one embodiment, the local power supply node is coupled to the global power supply node by means of at least one decoupling transistor receiving a control signal at its gate and by a vt-connected transistor, such that the voltage on the local power supply node is maintained at a level not exceeding one transistor threshold voltage less than the global power supply node voltage when the decoupling transistor is off. When the decoupling transistor(s) is/are switched on prior to word line driving operation, the voltage on the local power supply node rises to the voltage of the global power supply node. Preferably, the control signal(s) controlling the decoupling transistor(s) are, or are derived from, control signals generated for purposes other than controlling the decoupling transistor.

35 Claims, 5 Drawing Sheets

METHOD AND APPARATUS FOR STANDBY POWER REDUCTION IN SEMICONDUCTOR DEVICES

FIELD OF THE INVENTION

This invention relates generally to semiconductor devices, and more particularly relates to methods and apparatuses for reducing power consumption of semiconductor devices.

BACKGROUND OF THE INVENTION

The field of semiconductor memory devices generally and complementary metal-oxide semiconductor (CMOS) devices in particular is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

In the field of semiconductor fabrication, a persistent issue has been that of current leakage through thin dielectric layers. Those of ordinary skill in the art will appreciate that leakage through the gate dielectrics of field-effect transistors (FETs) is common referred to Fowler-Nordheim tunneling, whereas gate-induced diode leakage (GIDL) occurs at the edge of gate electrode. (This phenomenon is also interchangeably referred to as gate-induced drain leakage.) It is believed that any transistor having a gate overlying source or drain diffusion region to at least some extent is susceptible to GIDL. As gate dielectrics, which are typically formed of silicon oxide, become increasingly thinner due to continued scaling of semiconductor structures in pursuit of faster and more efficient operation, problems relating to GIDL present an ongoing challenge to circuit designers.

GIDL results from the generation of electron-hole pairs in the surface of the depletion region of a FET along the area where the gate conductor overlies the drain diffusion region (separated by a dielectric layer) when the device is biased such that the drain potential is greater than the gate potential (for NMOS devices) or lower than the gate potential (for PMOS devices). FIG. 1 is a side cross-sectional illustration of a portion of a FET 10 including a gate conductor 12 and a drain diffusion region 14 formed on a silicon substrate 16. As shown in FIG. 1, it is often the case that a portion of the drain diffusion region 14 of a FET is positioned under the gate conductor 12. As a result, for an NMOS device, if the gate conductor 12 is at 0 volts and the drain diffusion region 14 is at a positive voltage, there is volume 18 of carrier generation due to the electric field induced by the drain-to-gate voltage differential $\Delta V_{GIDL}$. Such carrier generation tends to impair device performance. In addition to increasing standby power, in the context of dynamic random access memory devices, GIDL can degrade data retention time, such that the maximum time between refreshes of a memory array is undesirably decreased.

Various approaches have been proposed in the prior art for overcoming GIDL phenomena in semiconductor devices. Prominent among these are strategies for either increasing the thickness of the gate oxide in a FET, or for otherwise making the gate oxide more resistant to leakage current; various doping strategies for minimizing GIDL effects have also been proposed. Various approaches are proposed, for example, in U.S. Pat. No. 6,294,421 to Gonzalez et al., entitled "Method of Fabricating Dual-Gate Dielectric;" in 6,097,070 to Mandelman et al, entitled "MOSFET Structure and Process for Low Gate Induced Drain Leakage (GILD) [sic];" in U.S. Pat. No. 6,090,671 to Balasubramanyam et al., entitled "Reduction of Gate-induced Drain Leakage in Semiconductor Devices;" and U.S. Pat. No. 6,297,105 to Guo, entitled "Method of Forming Asymmetric Source/Drain for a DRAM Cell." Each of the foregoing patents is hereby incorporated by reference herein in its entirety.

Despite semiconductor designers' ongoing efforts to stabilize and minimize the power consumption of semiconductors and in particular to minimize the undesirable phenomenon of GIDL, there nevertheless continues to be an ongoing need for improvements in the field. Among other considerations, the various proposed strategies for alleviating GIDL phenomenon in semiconductor devices often suffer to greater or lesser extents from the disadvantages of unduly increasing device size, adding complexity to the fabrication process, or degrading device performance.

SUMMARY OF THE INVENTION

In view of the foregoing considerations, the present invention is directed to a method and apparatus for reducing the effects of GIDL in semiconductor devices.

In one embodiment of the invention, the invention is applied to word line driver circuitry in a semiconductor memory device, and entails providing circuitry for locally reducing the supply voltage to elements of the word line driver circuitry during selected periods of device operation.

In accordance with one aspect of the invention, a local power supply node in a semiconductor device is selectively coupled to a supply potential by means of one or more decoupling transistors. The decoupling transistor(s) is/are controlled by means of one or more control signals to interrupt the direct coupling of the local power supply node to the supply potential only during selected operational events, thereby locally reducing the voltage supplied to elements susceptible to GIDL.

In accordance with another aspect of the invention, a "global" power supply signal (i.e., a signal provided to various functional elements throughout an integrated circuit), is coupled to a local power supply node by means of one or more decoupling transistors, as well as by a vt-connected transistor. When the one or more decoupling transistors are off, the voltage on the local power supply node is prevented from exceeding approximately one transistor threshold voltage (vt; approximately 0.6- to 0.7-volts) less than the global power supply signal level. The reduced voltage on the local power supply node lessens the GIDL current in the GIDL-susceptible elements, including P-channel transistors, coupled the local power supply node.

In accordance with another aspect of the invention the one or more decoupling transistors are switched on in advance of a word line driving operation, such that the voltage on the local power supply node is raised to the level of the global power supply signal during word line drives.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
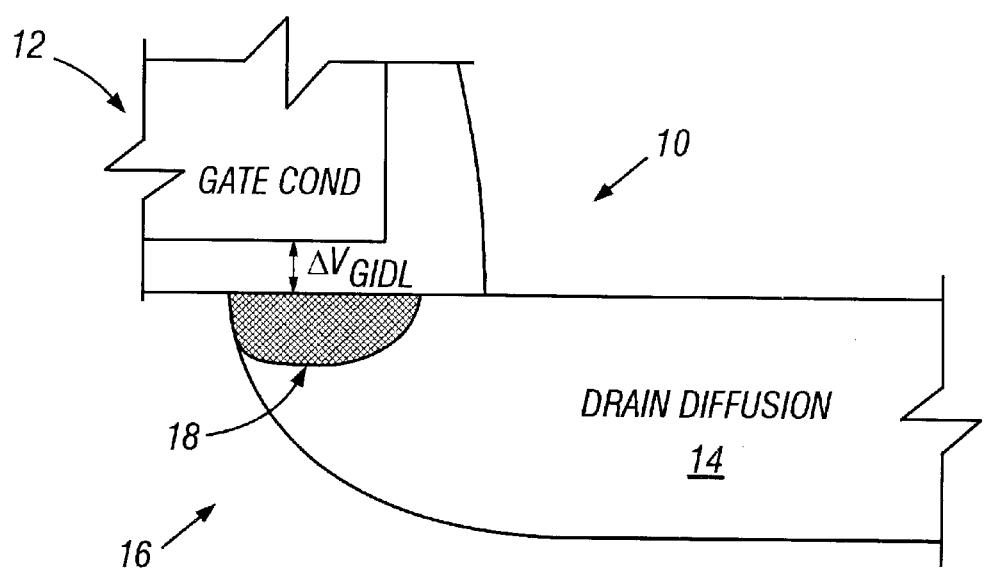
FIG. 1 is side, cross-sectional view of a portion of a field-effect transistor (FET) implemented on a semiconductor substrate.
Figure 2:
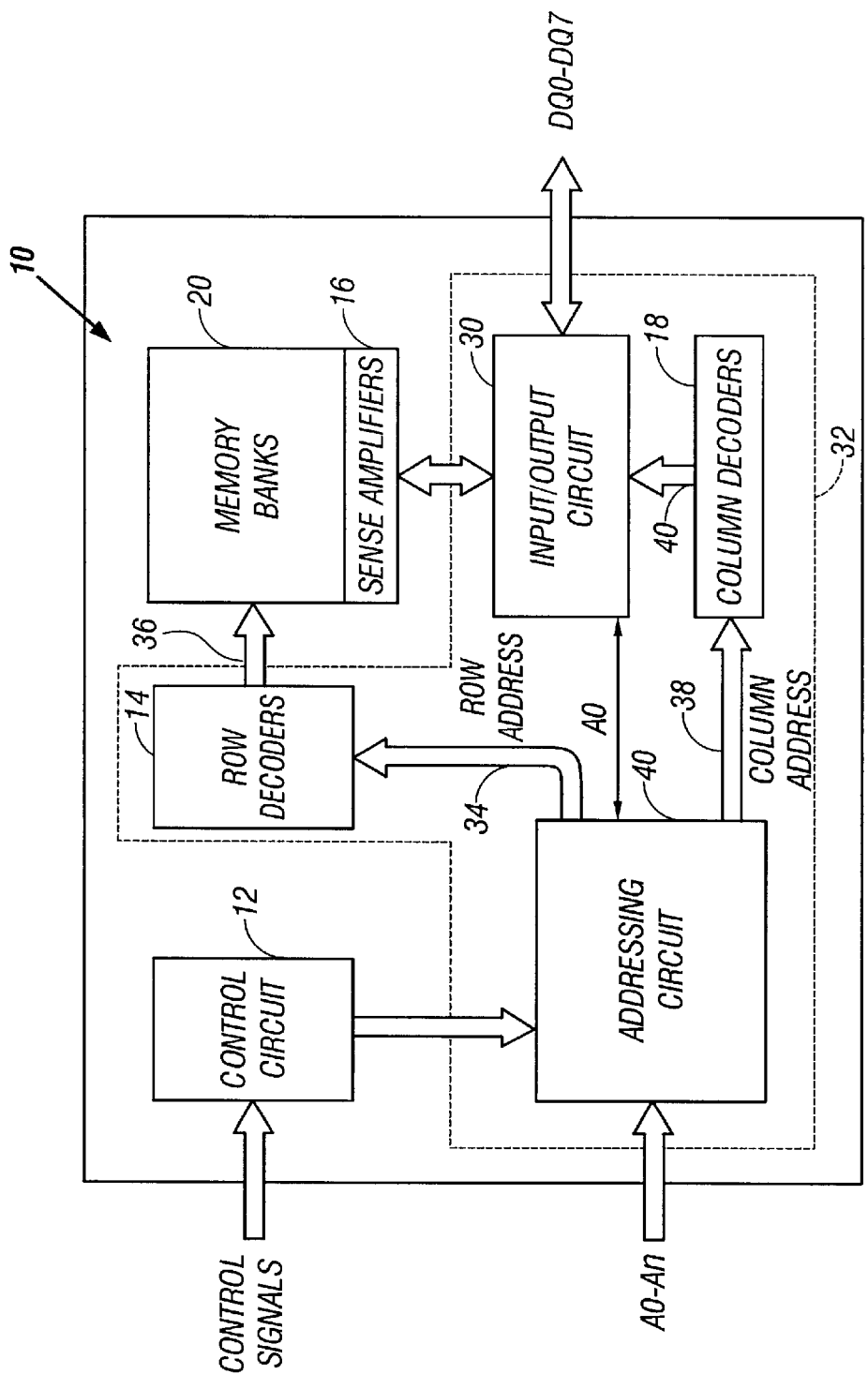
FIG. 2 is a schematic/block diagram of a semiconductor memory device in accordance with one embodiment of the invention.

Referring to FIG. 2, there is shown a highly simplified schematic/block diagram of a semiconductor memory device 10 in accordance with one embodiment of the invention. In the disclosed embodiment, memory device 10 is a dynamic random access memory (DRAM), although those of ordinary skill in the art having the benefit of the present disclosure will appreciate that the invention may not be limited in scope to application in DRAM only. It will also be understood that DRAM 10 incorporates a substantial amount of circuitry in addition to those functional components specifically represented in FIG. 1. However, such other circuitry has been omitted in the interests of brevity and clarity, since such circuitry is well-known to those of ordinary skill in the art and is not especially relevant to the practice of the present invention.

Memory device 10 includes a control circuit 12, addressing circuit 40, input/output circuit 30, memory banks 20, sense amplifier circuits 16, column decoders 18 and row decoders 14. In a preferred embodiment, four memory banks 20, sense amplifier circuits 16, column decoders 18 and row decoders 14 are used, but for convenience purposes only, FIG. 2 illustrates one memory bank 20, sense amplifier circuit 16, column decoder 18 and row decoder 14. In a preferred embodiment, four memory banks 20 are used, but it must be noted that the present invention can utilize, for example, one, two, four, eight or more memory banks 20. The row and column decoders 14, 18, addressing circuit 30 and input/output logic circuit 30 comprise a read/write path circuit 32 providing a data path for reading and writing data into the banks 20 from an external device (through input/output pins DQ0–DQ7). It is to be noted that the illustrated configuration of the read/write path circuit 32 is but one of many possible configurations and the invention is not to be so limited to the specific circuit illustrated in FIG. 2.

In one embodiment, memory device 10 contains eight input/output pins DQ0–DQ7. This is referred to as a "by 8" device since eight bits are input or output at one time. It must be noted that the SDRAM 10 can also be configured to have fewer than eight input/output pins (e.g., a "by 4" device) or greater than eight input/output input/output pins (e.g., a "by 16" device).

Control circuit 12 is coupled to address circuit 40 and receives various external control signals as inputs. By way of example but not limitation, control circuit 12 may receive a chip select (CS*) signal and a RESET signal, row and column address strobe (RAS and CAS) signals, a write enable (WE*) signal, and so on. Those of ordinary skill in the art will be familiar with the various control signals applied to device 10. Although not shown in FIG. 2, control circuitry 12 is likely to be coupled to most of the other functional components of device 10, in a conventional arrangement, such that control circuitry 12 is capable of interpreting the various control signals applied thereto and drive and control the overall operation of the remaining circuitry in device 10.

In operation, the address of a memory location to be accessed (written to or read from) is applied to address inputs A0–An in conjunction with an appropriate sequence of control signals being applied to control circuit 12 according to the operation to be performed. Row address data is communicated to row decoders 14 by a row address bus. In a conventional manner, row decoders operate to assert appropriate word lines 36 that are applied to memory bank 20 to select a desired row therein. The row of data selected by an asserted row line is applied to I/O circuit 30. Column address information applied to address inputs A0–An is communicated to column decoders 18 by way of a column address bus 38. Column decoders decode the column addresses and assert appropriate column select lines 40 to select the desired bits in the selected row. The selected data is the presented on I/O pins DQ0–DQ7.

It is to be understood that although the various functional components of device 10 depicted in FIG. 2 are shown as separate, discrete circuits disposed in a well-defined spatial relationship with respect to one another, in actual implementation, the various circuits are likely to be dispersed throughout part or all of the semiconductor substrate, with portions of certain functional components being interspersed with one another. That is, FIG. 2 depicts device 10 from a functional perspective rather than a physical layout perspective.

Figure 3:
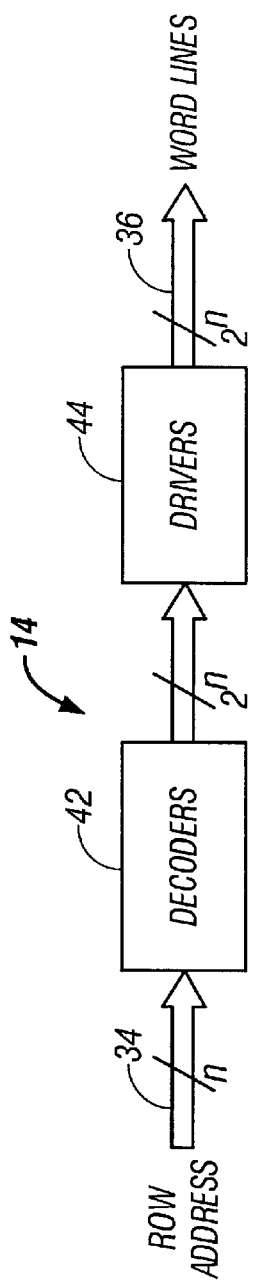
FIG. 3 is a block diagram of row decoder circuitry in the semiconductor device of FIG. 2.

Turning now to FIG. 3, there is shown a simplified schematic diagram of a portion of row decoder circuit 14 and related circuitry in the memory device of FIG. 2. As can be seen from FIG. 3, decoders 14 comprise a decoder circuit 42 and a driver circuit 44. Decoder circuit receives the row address from row address bus 34 and provides the decoded address to driver circuits 44. Drivers 44 then assert the word line(s) 36 corresponding to the selected address.

Figure 4:
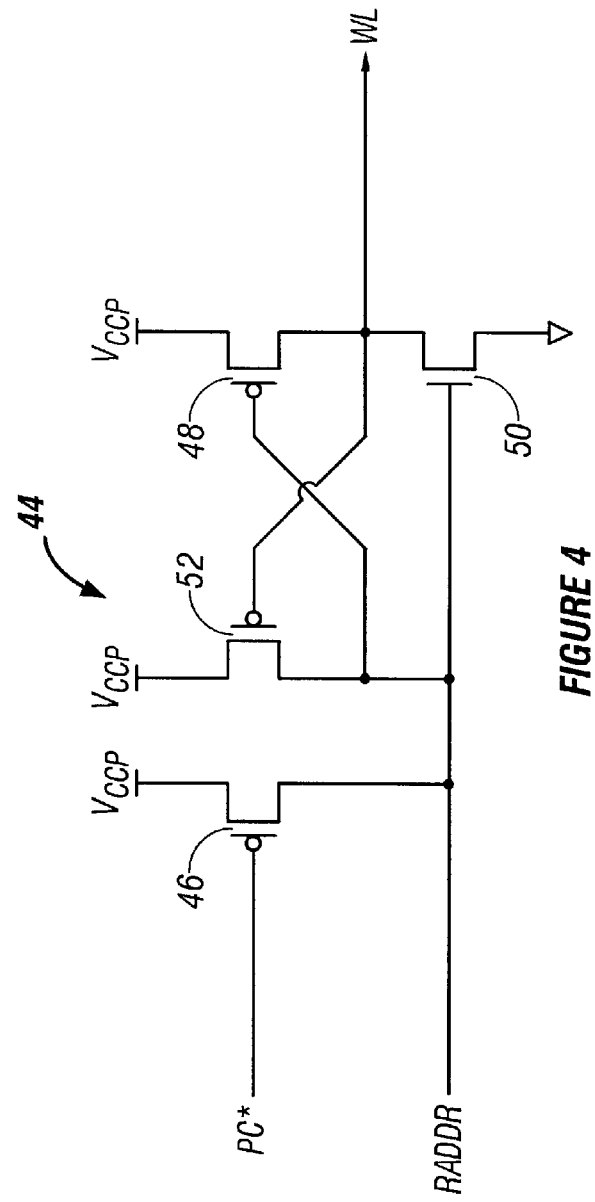
FIG. 4 is a schematic diagram of a prior art word line driver circuit useable in the row decoder circuitry of FIG. 3.

Those of ordinary skill in the art will appreciate that for every n row address bits, there will be $2^n$ word lines, and hence $2^n$ word line drivers 44. In FIG. 4, there is shown an individual word line driver 44 of the prior art, it being understood that an essentially identical such circuit would be provided for each word line in memory bank(s) 20. Each driver circuit 44 receives two inputs: a precharge (PC*) signal and an address signal RADDR.

Each driver circuit comprises a P-type precharge transistor 46, a P-type pull-up transistor 48, an N-type pull-down transistor 50, and a P-type transistor 52 in cross-coupled relationship with pull-up transistor 48. Those of ordinary skill in the art will appreciate that driver 44 operates to assert (high) word line output WL if RADDR is low, and to deassert WL if RADDR is high.

As shown in FIG. 4, each of the P-type transistors 46, 48, and 52 has its source terminal coupled directly to a supply voltage node $V_{ccp}$, which may be at a voltage of, for example, 3.3 volts. Supply voltage node $V_{ccp}$ can be considered to be a "global" supply voltage node, in that it is a voltage supplied in all likelihood to more than one functional element of the semiconductor device, as contrasted with a "local" supply voltage node, which is provided to supply power locally to a particular functional element in the device. As used herein, the term "local power supply node" shall refer to a node which is coupled to a global supply node by means of an intervening device, such as a transistor, such that the voltage on the local supply node can be changed independently from the voltage on the global supply node. Those of ordinary skill in the art will recognize that there may be numerous different motivations for providing "local" supply voltage nodes, not the least of which being the desire to prevent the operation of one functional element from adversely affecting or interfering with the characteristics of electrical power supplied to others, and to enable different power signals to be provided to elements having differing electrical requirements.

In the present embodiment, transistors 46, 48, and 52 are fabricated such that they are susceptible to GIDL. As discussed above, such susceptibility to GIDL arises when a transistor's gate overlies a diffusion region of the transistor and a sufficient voltage differential between the gate and the diffusion region results in an electric field and resultant leakage current. In particular, it can be seen from FIG. 4 that since the source terminals of transistors 46, 48, and 52 are tied directly to the global $V_{ccp}$ node, there is significant risk of gate-induced diode leakage (GIDL) when the driver circuit 44 is in standby with transistor 48 turned off, creating a $V_{ccp}$-to-ground voltage across transistor 48. This problem is especially critical in view of the large number of word line driver circuits present in each memory block.

Figure 5:
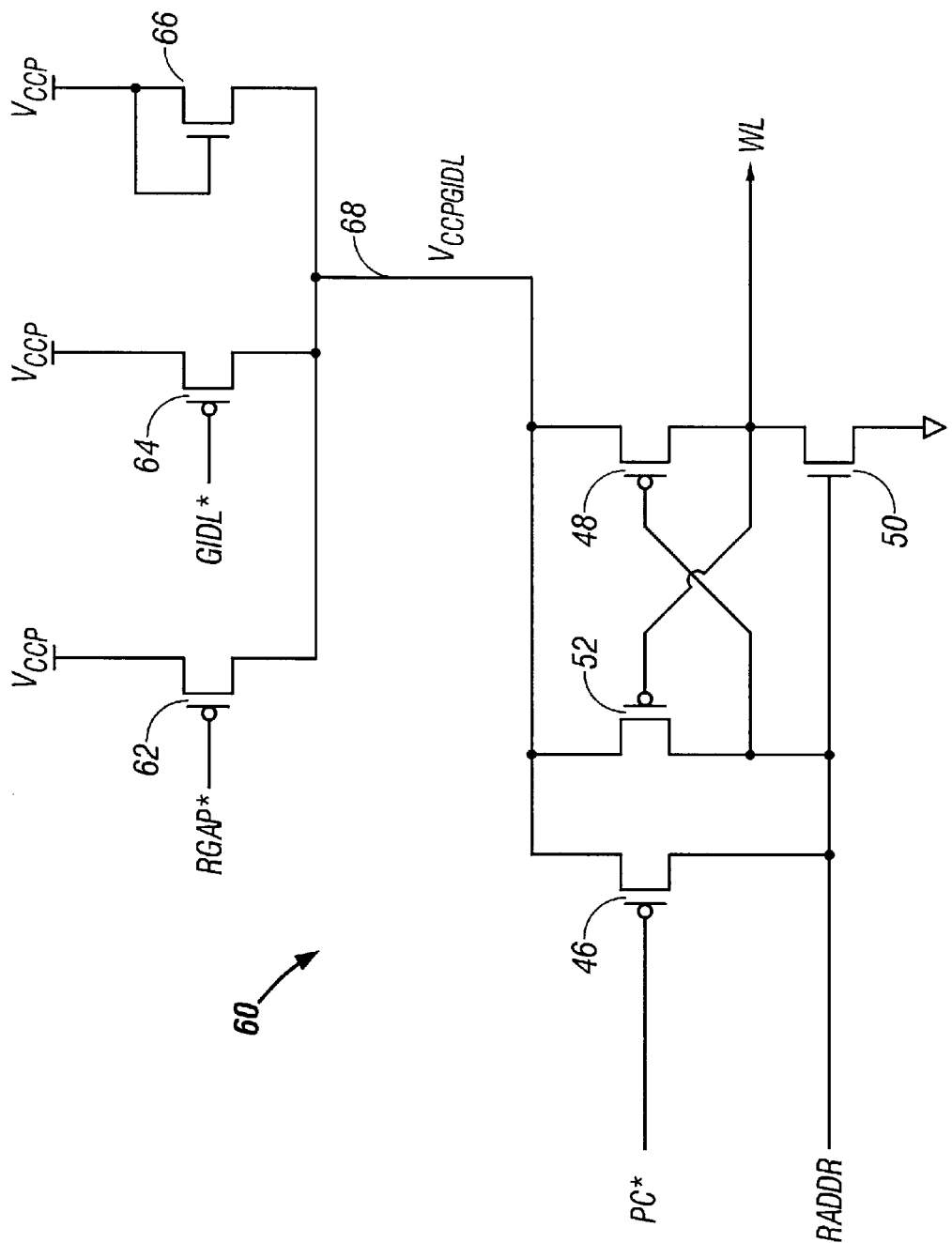
FIG. 5 is a schematic diagram of a word line driver circuit in accordance with one embodiment of the invention.

Turning to FIG. 5, therefore, there is shown a word line driver circuit 60 in accordance with one embodiment of the invention. It is to be understood that the elements in the circuit of FIG. 5 that are substantially the same as in FIG. 4 have retained identical reference numerals. Word line driver circuit 60 in FIG. 5 comprises the same arrangement of transistors 46, 48, 50 and 52. However, in the case of transistors 46, 48, and 52, and in accordance with one aspect of the invention, the direct connection to the global supply node $V_{ccp}$ is eliminated. Instead, as shown in FIG. 5, a pair of P-channel switches 62 and 64 and a voltage-reducing element comprising in one embodiment a vt-connected N-channel device 66 (i.e., a transistor having its gate and drain terminal coupled together) are placed between global supply potential $V_{ccp}$ and the respective source terminals of transistors 46, 48, and 52. This establishes a "local" $V_{ccp}$ power supply node referred to as $V_{ccpGIDL}$, and designated with reference numeral 68 in FIG. 5. By controlling the on and off states of transistors 62 and 64, the connection between the local power supply node 68 from global power supply node $V_{ccp}$ can be selectively interrupted, with the voltage-reducing element 66 providing a voltage-reducing connection between $V_{ccp}$ power supply node and local supply node 68.

In operation, during non-active periods for driver 60, switches 62 and 64 are turned off and local supply node $V_{ccpGIDL}$ 68 is permitted to drift below $V_{ccp}$ due to leakage current through transistor 48. Voltage-reducing element 66, holds $V_{ccpGIDL}$ at a maximum of one threshold voltage (vt) below $V_{ccp}$. (It is contemplated that other voltage-reducing connections might be utilized, including, without limitation, more than one vt-connected transistor.) When the leakage current through transistor 48 and the current through device 66 are equal, the $V_{ccpGIDL}$ voltage will stabilize. This reduced voltage $V_{ccpGIDL}$ will cause the electric field in the drain regions of transistor 48 to be reduced and will therefore reduce any GIDL leakage current.

On the other hand, when a row is activated, switches 62 and 64 turn on and the row-decoder P-channel source nodes (the source terminals of transistors 46, 48, and 52 will be driven to the global $V_{ccp}$ node voltage level so that a word line can be activated.

In the disclosed embodiment, a first signal RGAP* is used to control switch 62, while a second signal GIDL* is used to control switch 64. Preferably, as in the disclosed embodiment, control signals RGAP* and GIDL* are, or are derived directly from, signals present for other purposes such that their use in controlling switches 62 and 64 is merely incidental to their primary purpose. In the way, the amount of extra circuitry necessary for the practice of the present invention is minimized. In the disclosed embodiment, RGAP* and GIDL are substantially overlapping clock signals. In particular, RGAP*, which turns on slightly earlier than GIDL, is a decode signal used to select a group of word lines in memory bank 20 in response to a portion of the applied memory address during a read/write cycle. GIDL*, which turns off slightly later than RGAP*; is a control signal for activating and deactivating sense amplifier isolation transistors, which are shared between adjacent sub-arrays of memory cells in memory bank 20. Because both RGAP* and GIDL* are utilized to control the coupling between the global $V_{ccp}$ node voltage level and the $V_{ccpGIDL}$ node, the early turning on of RGAP* and the late turning off of GIDL* ensures that the global $V_{ccp}$ node voltage level is passed onto $V_{ccpGIDL}$ as soon as possible before the word line WL is activated and stays on the $V_{ccpGIDL}$ until after the row decoder is reset. On the other hand, it is contemplated that the present invention may be effectively practiced using only a single switch in place of switches 62 and 64, depending upon the timing of the signal used to control such single switch.

Figure 6:
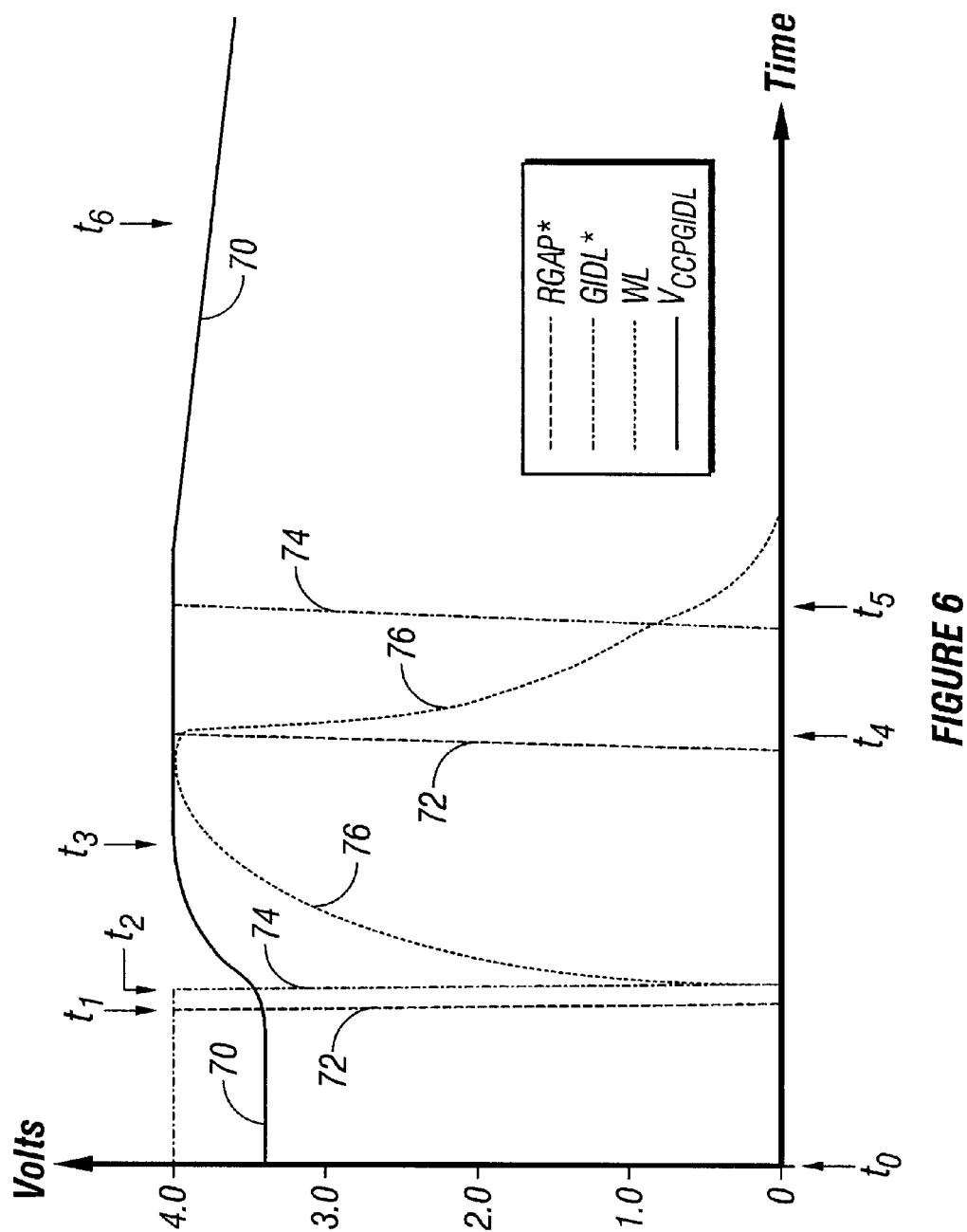
FIG. 6 is a timing diagram showing the levels of various signals during operation of the word line driver circuit of FIG. 5.

FIG. 6 is a timing diagram illustrating the timing of various signals present in driver 60 of FIG. 5. In the example of FIG. 6, a global supply potential $V_{ccp}$ of 4.0 volts is assumed. Initially, at time $t_0$, the local supply node voltage $V_{ccpGIDL}$ for driver 60 (the waveform designated with reference numeral 70 in FIG. 6) is at the equilibrium level at which the current through transistor 66 is equal to the leakage current through transistors 48. At time $t_1$, the first control signal RGAP* is asserted, as shown in FIG. 6 (reference numeral 72); this turns on switch 62, thereby coupling global supply node $V_{ccp}$ to the local $V_{ccpGIDL}$ node. By time $t_3$, $V_{ccpGIDL}$ has risen to full $V_{ccp}$ level. At time $t_2$, control signal GIDL* (reference numeral 74) is asserted, thereby turning on transistor 64 and even more strongly tying $V_{ccpGIDL}$ to the full $V_{ccp}$ level.

After GIDL* 74 is asserted, the word line WL (reference numeral 76) is driven high. At the end of the access cycle, RGAP* 72 is deasserted, thereby resetting the word line, beginning at time $t_4$, and GIDL* 74 is deasserted beginning at time $t_5$. Beginning at time $t_5$, therefore, both switches 62 and 64 will be open, such that the local $V_{ccpGIDL}$ node's voltage will begin drifting to its lower equilibrium value, approximately one transistor threshold voltage (vt) below $V_{ccp}$. This downward drift in voltage is clearly evident by time $t_6$ in FIG. 6.

From the foregoing detailed description of specific embodiments of the invention, it should be apparent that a method and apparatus for reducing current leakage in a semiconductor device has been disclosed. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

What is claimed is:

1. A driver circuit for a semiconductor memory device, comprising:
   at least one circuit element susceptible to current leakage;
   a local power supply node, coupled to said at least one circuit element to provide power thereto;
   a global power supply node;
   a first transistor, having a source terminal coupled to said global power supply node and a drain terminal coupled to said local power supply node, and having a gate terminal for receiving a control signal thereon;
   a voltage-reducing element coupled between said global power supply node and said local power supply node.

2. A driver circuit in accordance with claim 1, wherein said driver circuit drives a word line of said memory device.

3. A driver circuit in accordance with claim 1, wherein said voltage-reducing element comprises a second transistor having a drain terminal and a gate terminal each coupled to said global power supply node and having a source terminal coupled to said local power supply node.

4. A driver circuit in accordance with claim 1, wherein said at least one circuit element comprises a third transistor.

5. A driver circuit in accordance with claim 4, wherein said current leakage comprises gate-induced diode leakage.

6. A driver circuit in accordance with claim 5, wherein said third transistor is a P-channel transistor.

7. A driver circuit in accordance with claim 6, wherein said third transistor is a pull-up transistor for a word line in said memory device.

8. A driver circuit in accordance with claim 1, wherein said semiconductor memory device is a dynamic random access memory device.

9. A driver circuit in accordance with claim 1, wherein when said control signal controls said first transistor to an off state, the voltage on said global power supply node exceeds the voltage on said local power supply node by a predetermined amount.

10. A driver circuit in accordance with claim 9, wherein said predetermined amount is approximately one transistor threshold voltage.

11. A driver circuit in accordance with claim 9, wherein when said control signal controls said first transistor to an on state, the voltage on the local power supply node is substantially equal to the voltage on said global power supply node.

12. A semiconductor memory device, comprising:
    an array of rows and columns of memory cells;
    row decoder circuitry, coupled to said array of rows and columns of memory cells, responsive to a row address to drive a row line applied to said array to a high state;
    wherein said row decoder circuitry comprises:
    at least one circuit element susceptible to current leakage;
    a local power supply node, coupled to said at least one circuit element to provide power thereto;
    a global power supply node;
    a first transistor, having a source terminal coupled to said global power supply node and a drain terminal coupled to said local power supply node, and having a gate terminal for receiving a control signal thereon;
    a voltage-reducing element coupled between said global power supply node and said local power supply node.

13. A semiconductor memory device in accordance with claim 12, wherein said voltage-reducing element comprises a second transistor having a drain terminal and a gate terminal each coupled to said global power supply node and having a source terminal coupled to said local power supply node.

14. A semiconductor memory device in accordance with claim 12, wherein said at least one circuit element comprises a third transistor.

15. A semiconductor memory device in accordance with claim 14, wherein said current leakage comprises gate-induced diode leakage.

16. A semiconductor memory device in accordance with claim 15, wherein said third transistor is a P-channel transistor.

17. A semiconductor memory device in accordance with claim 16, wherein said third transistor is a pull-up transistor for a word line in said memory device.

18. A semiconductor memory device in accordance with claim 12, wherein said semiconductor memory device is a dynamic random access memory device.

19. A semiconductor memory device in accordance with claim 12, wherein when said control signal controls said first transistor to an off state, the voltage on said global power supply node exceeds the voltage on said local power supply node by a predetermined amount.

20. A semiconductor memory device in accordance with claim 19, wherein said predetermined amount is approximately one transistor threshold voltage.

21. A semiconductor memory device in accordance with claim 19, wherein when said control signal controls said first transistor to an on state, the voltage on the local power supply node is substantially equal to the voltage on said global power supply node.

22. A method of operating a semiconductor memory device comprising at least one element susceptible to current leakage, comprising:
    (a) coupling said at least one element to a power supply node by means of at least one switch operable between on and off states;
    (b) coupling said at least one element to a power supply node by means of a voltage-reducing element;
    (c) selectively operating said at least one switch between said on and off states in response to a control signal, such that current leakage through said at least one element is reduced when said switch is in said off state relative to when said switch is in said on state.

23. A method in accordance with claim 22, wherein said at least one element comprises a transistor.

24. A method in accordance with claim 23, wherein said at least one element comprises a P-channel transistor.

25. A method in accordance with claim 22, wherein said voltage reducing element comprises a vt-connected transistor having a gate and drain terminal coupled to said power supply node and a source terminal coupled to said transistor.

26. A method in accordance with claim 22, wherein said current leakage comprises gate-induced diode leakage.

27. A method of driving a word line in a semiconductor memory device, comprising:

(a) coupling said word line to a drain terminal of a pull up transistor having a source terminal coupled to a local power supply node;

(b) coupling said local power supply node to a global power supply node by means of at least one switch operable between on and off states;

(c) coupling said local power supply node to said global power supply node by means of a voltage-reducing element;

(d) selectively operating said at least one switch between said on and off states.

28. A method in accordance with claim 27, wherein said step (d) of selectively operating said at least one switch between said on and off states comprises operating said at least one switch to said on state in advance of a word line drive operation in which said pull-up transistor is to be turned on.

29. A method in accordance with claim 28, wherein said step (d) of selectively operating said at least one switch between said on and off states comprises operating said at least one switch to said off state following completion of a word line drive operation wherein said pull-up transistor was turned on and turned off.

30. A method in accordance with claim 27, wherein said step (c) of coupling said local power supply node to said global power supply node by means of a voltage reducing element comprises coupling a drain and a gate terminal of a vt-connected transistor to said global power supply node and coupling a source terminal of said vt-connected transistor to said local power supply node.

31. A method of reducing gate-induced diode leakage in a semiconductor memory device having at least one transistor requiring application of a supply voltage to a terminal thereof, comprising:

(a) coupling said terminal to said supply voltage by means of a switch operable between on and off states;

(b) coupling said terminal to said supply voltage by means of a voltage-reducing element;

(c) selectively operating said switch between said on and off states.

32. A method in accordance with claim 31, wherein said at least one transistor comprises a plurality of word line pull-up transistors.

33. A method in accordance with claim 32, wherein said step (c) of selectively operating said at least one switch between said on and off states comprises operating said at least one switch to said on state in advance of a word line drive operation in which one of said plurality of pull-up transistors is to be turned on.

34. A method in accordance with claim 32, wherein said step (c) of selectively operating said at least one switch between said on and off states comprises operating said at least one switch to said off state following completion of a word line drive operation wherein at least one of said plurality of pull-up transistor was turned on and turned off.

35. A method in accordance with claim 32, wherein said step (b) of coupling said local power supply node to said global power supply node by means of a voltage-reducing element comprises coupling a drain and a gate terminal of a vt-connected transistor to said global power supply node and coupling a source terminal of said vt-connected transistor to said local power supply node.

* * * * *